United States Patent [19]

Marumo

[11] Patent Number: 5,436,693
[45] Date of Patent: Jul. 25, 1995

[54] SUBSTRATE HOLDING APPARATUS AND A SYSTEM USING THE SAME

[75] Inventor: Mitsuji Marumo, Sagamihara, Japan

[73] Assignee: Canon Kabushiki Kaisha, Tokyo, Japan

[21] Appl. No.: 119,395

[22] Filed: Sep. 13, 1993

[30] Foreign Application Priority Data

Nov. 10, 1992 [JP] Japan .................................. 4-299977

[51] Int. Cl.⁶ .............................................. B25B 11/00
[52] U.S. Cl. ........................................ 355/73; 355/53; 269/21
[58] Field of Search ............... 355/53, 73, 87, 95; 269/21, 266, 309

[56] References Cited

U.S. PATENT DOCUMENTS

| | | | |
|---|---|---|---|
| 4,655,584 | 4/1987 | Tanaka et al. | 355/53 |
| 4,872,938 | 10/1989 | Davis et al. | 146/345 |
| 5,148,214 | 9/1992 | Ohta et al. | 355/43 |
| 5,160,961 | 11/1992 | Marumo et al. | 355/53 |
| 5,191,218 | 3/1993 | Mori et al. | 250/453.11 |
| 5,203,547 | 4/1993 | Marumo | 269/21 |
| 5,231,291 | 7/1993 | Amemiya et al. | 250/443.1 |

*Primary Examiner*—Michael L. Gellner
*Assistant Examiner*—D. P. Malley
*Attorney, Agent, or Firm*—Fitzpatrick, Cella, Harper & Scinto

[57] ABSTRACT

A substrate holding apparatus includes a pump, serving as a suction source, a conveying chuck for holding a wafer substrate by suction, a connection arrangement, including parallel lines intermediate the connection arrangement, for conneting the pump to the chuck, and a valve arrangement including at least one valve provided in at least one of the parallel lines. By selecting one of the parallel lines by controlling opening/closing of these valves, the conductance of the connection line is adjusted, whereby the optimum suction pressure for the chuck is set.

15 Claims, 6 Drawing Sheets

SUBSTRATE HOLDING APPARATUS AND A SYSTEM USING THE SAME

BACKGROUND OF THE INVENTION

1. Field of the Invention

This invention relates to a technique relating to holding, transfer and the like of a substrate by suction, which is used, for example, for manufacturing semiconductor devices.

2. Description of the Related Art

FIG. 6 illustrates a conventional apparatus for holding a semiconductor wafer by a vacuum suction method, which is used, for example, for a semiconductor-device manufacturing apparatus. In this substrate holding apparatus, conveying chuck 131 for holding wafer 141 by suction is mounted on a conveying mechanism having an X-stage 133 moving in the x-direction (the lateral direction in FIG. 6) and a Z-stage 134 moving in the z-direction (a direction perpendicular to the plane of FIG. 6). Wafer 141 is transferred between conveying chuck 131, and wafer chuck 132 for holding wafer 141 by suction during an exposure operation. These components are housed within chamber 142 maintained under a reduced pressure.

Conveying chuck 131 is connected to distributor 139 by connection line 135 having first valve 137 at a midpoint thereof. Wafer chuck 132 is connected to distributor 139 by connection line 136 having second valve 138 at a midpoint thereof. Distributor 139 is connected to pump 140.

Each of conveying chuck 131 and wafer chuck 132 holds and releases wafer 141 by a suction operation of pump 140. Each of valves 137 and 138 is a three-way valve, which can switch between a first state in which each of conveying chuck 131 and wafer chuck 132 communicates with pump 140, respectively, and a second state in which each of conveying chuck 131 and wafer chuck 132 communicates with the atmosphere within chamber 142, respectively.

An explanation will now be provided of a case in which wafer 141 is transferred from conveying chuck 131 to wafer chuck 132. First, in order to hold wafer 141 by conveying chuck 131 by suction, first valve 137 is maintained in the first state in which conveying chuck 131 communicates with pump 140, and pump 140 is operated to hold wafer 141 by suction by conveying chuck 131. At that time, second valve 138 is maintained in the second state in which wafer chuck 132 communicates with the atmosphere of chamber 142, so that the pressure within second vacuum line 136 equals the pressure of the atmosphere within chamber 142.

Thereafter, by driving X-stage 133, wafer 141 held by conveying chuck 131 by suction is moved onto the surface of wafer chuck 132. Then, by driving Z-stage 134, conveying chuck 131 is moved until wafer 141 contacts the surface of wafer chuck 132. When wafer 141 has contacted the suction surface of wafer chuck 132, second valve 138 is switched to the first state, whereby wafer 141 is held by suction by wafer chuck 132. That is, wafer 141 is held by suction by both conveying chuck 131 and wafer chuck 132. Thereafter, first valve 137 is switched to the second state in which conveying chuck 131 communicates with the atmosphere of chamber 142. Thus, the holding force of conveying chuck 131 by suction disappears, and wafer 141 is held by suction only by wafer chuck 132. Thereafter, by sequentially driving Z-stage 134 and X-stage 133, conveying chuck 131 is returned to the original position. Thus, the tranfer of wafer 141 to wafer chuck 132 is completed.

While wafer 141 is held by wafer chuck 132, a circuit pattern is exposed and transferred onto wafer 141 by an exposure apparatus (not shown). Thereafter, by driving X-stage 133 and Z-stage 134, conveying chuck 131 is moved to the position of wafer chuck 132 in order to transfer wafer 141. This tranfer operation is inverse to the above-described transfer operation of wafer 141 from conveying chuck 131 to wafer chuck 132.

The above-described conventional approach, however, has the following problems to be solved.

(1) The minimum differential pressure necessary for holding the substrate by suction, i.e., the critical differential pressure dPL depends on the following items:

1) The surface roughness of the holding surface of the substrate holding apparatus.

2) The flatness of the holding surface of the substrate holding apparatus.

3) The suction area of the holding surface of the substrate holding apparatus.

When the substrate is held, transferred and conveyed by setting the suction pressure to the critical differential pressure dPL, the subtrate cannot be held and leaves the surface of the chuck if, for example, a part of the coated resist moves to the back of the substrate, or dust adheres to the suction surface. On the other hand, if the suction pressure is set to the maximum differential pressure, time is needed until the suction pressure reaches the set pressure, causing a decrease in the throughput of the operation.

(2) If the substrate is conveyed at a high speed, the conveying speed and the acceleration until the speed reaches the conveying speed increase. Hence, it is necessary to prevent the substrate from dropping by increasing the differential pressure between the suction pressure of the conveying chuck and the pressure of the atmosphere of the chamber. On the other hand, when performing exposure using X-rays, it is necessary to transfer heat generated at a mask to a temperature-controlled wafer chuck. For that purpose, He (helium) gas is usually supplied between the mask and the wafer, and the wafer and the wafer chuck to increase the efficiency of heat conduction. If the differential pressure for the conveying chuck is increased as described above, the differential pressure for the wafer chuck is also increased. As a result, the degree of vacuum between the wafer and the wafer chuck increases, causing a reduction in the amount of He gas. The thermal contact resistance between the wafer and the wafer chuck thereby increases, causing a decrease in the efficiency of heat conduction.

(3) When a plurality of chucks, such as the above-described conveying chuck, wafer chuck and the like, are provided, since the suction area, the surface roughness and the like of the substrate holding surface differ for each chuck, the suction force differs even if the same suction pressure is provided.

SUMMARY OF THE INVENTION

It is an object of the present invention to overcome the above-described problems of the prior art.

It is another object of the present invention to maintain both the reliability and throughput of an operation of holding and transferring a substrate at a high level.

According to one aspect, the present invention which achieves these objectives relates to a substrate holding apparatus and an exposure apparatus including the same, comprising a suction source for providing suction, a holding mechanism for holding a substrate by suction provided from said suction source, a connection arrangement, including a plurality of parallel lines at a midpoint thereof, for connecting the suction source to the holding mechanism, a valve arrangement including at least one valve provided in at least one of the parallel lines, and a controller for adjusting the conductance of the connection arrangement by controlling opening/closing of the valve arrangement.

According to another aspect, the present invention which achieves these objectives relates to a substrate holding apparatus and an exposure apparatus including the same, comprising a suction source for providing suction, a holding mechanism for holding a substrate by suction provided from the suction source, a connection line for connecting the suction source to the holding mechanism, the connection line comprising an adjustment mechanism for adjusting the conductance of the connection line and being provided intermediate the connection line, and an accumulator provided intermediate the connection line for assisting the adjusting mechanism in adjusting the conductance of the connection line.

According to another aspect, the present invention provides a method of holding and exposing a substrate. The method includes the steps of providing a connection arrangement, including parallel lines intermediate the connection arrangement, for connecting a suction source to a holding mechanism, adjusting the conductance of the connection arrangement by controlling opening/closing of at least one valve provided in the parallel lines, holding the substrate by suction provided to the holding mechanism and exposing the held substrate.

In yet another aspect, the present invention provides a method of holding and exposing a substrate. The method includes the steps of providing suction to a holding mechanism that holds a substrate by suction, providing a connection line for connecting the suction source to the holding mechanism, the connection line having an accumulator intermediate the connection line, adjusting the conductance of the connection line by using the accumulator and exposing the held substrate.

BRIEF DESCRIPTION OF THE DRAWINGS

FIG. 8 is a diagram illustrating the configuration of a conventional apparatus.

DESCRIPTION OF THE PREFERRED EMBODIMENTS

Figure 1:
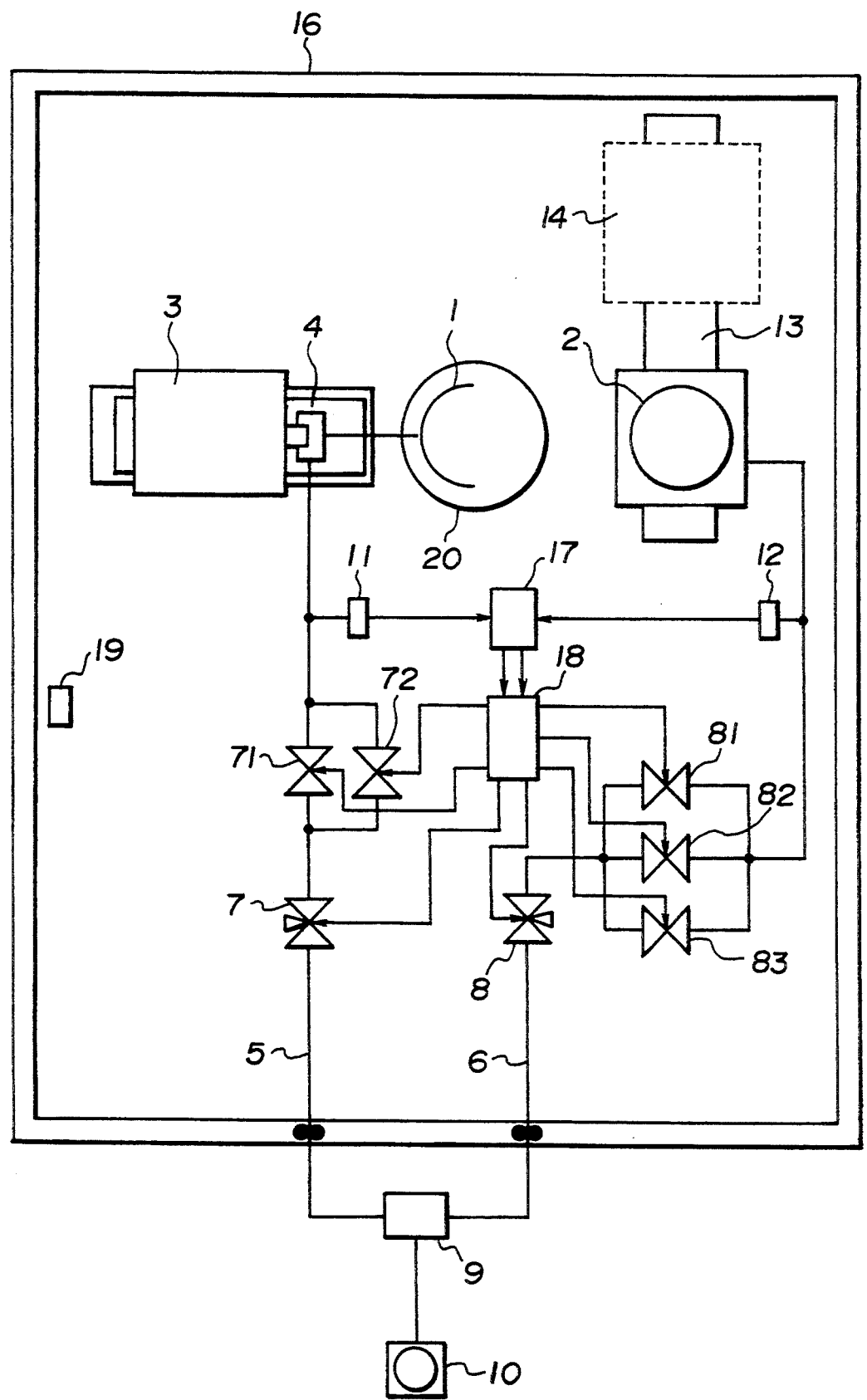
FIG. 1 is a diagram illustrating the configuration of a system according to a first embodiment of the present invention.

FIG. 1 is a diagram illustrating the configuration of a semiconductor manufacturing system according to a first embodiment of the present invention. Main components are housed within low-pressure chamber 16 maintained in an atmosphere of a predetermined reduced pressure. For example, He gas is supplied to low-pressure chamber 16. Both conveying chuck 1 and wafer chuck 2 can hold a wafer, serving as a semiconductor substrate, by suction. X-stage 3 moves conveying chuck 1 in the x-direction (the lateral direction in FIG. 1), and Z-stage 4 moves conveying chuck 1 in the z-direction (a direction perpendicular to the plane of FIG. 1). A substrate conveying mechanism including these stages transfers wafer 20 between a wafer cassette (not shown) for accommodating wafer 20 and wafer chuck 2. Wafer chuck 2 can be moved by conveying mechanism 13 between a wafer receiving position and an exposure position where an exposure apparatus 14 is installed, while holding wafer 20 by suction. A method of exposing and transferring a mask pattern onto a wafer by projecting the pattern onto the wafer using radiation energy, such as ultra-violet light, X-rays or the like, an exposure method in which a circuit pattern is directly drawn on a wafer using an electron beam, or the like is used as the exposure method of exposure apparatus 14.

Conveying chuck 1 and wafer chuck 2 are connected to pump 10, serving as a vacuum suction source, via two vacuum lines 5 and 6 obtained by distributing the suction line of pump 10 by distributor 9, respectively. Pump 10 and distributor 9 are provided outside low-pressure chamber 16.

First valve 7, which is a three-way valve, third valve 71 and fourth valve 72 connected to two lines branched in parallel, and first vacuum sensor 11 for detecting the pressure at the suction surface of conveying chuck 1 are successively provided in first vacuum line 5. Valves 71 and 72 are on-off valves having a simple mechanism. Second valve 8, which is a three-way valve, fifth valve 81, sixth valve 82 and seventh valve 83 connected to three lines branched in parallel, and second vacuum sensor 12 for detecting the pressure of the suction surface of wafer chuck 2 are successively provided in second vacuum line 6. Valves 81, 82 and 83 are on-off valves.

The two parallel lines in which third valve 71 and fourth valve 72 are provided have different conductance values. The three parallel lines in which fifth valve 81, sixth valve 82 and seventh valve 83 are provided have different conductance values. By selecting one of these lines by controlling opening/closing of these valves, the conductance of the entire vacuum line can be changed.

Main controller 17 controls the entire system, valve controller 18 controls opening/closing of the respective valves, and vacuum sensor 19 detects the pressure within low-pressure chamber 16, and maintains the atmosphere at a predetermined reduced pressure.

Next, a description will be provided of the function of the system having the above-described configuration. A state in which conveying chuck 1 or wafer chuck 2 communicates with pump 10 by controlling first valve 7 or second valve 8, which is a three-way valve, respectively, is defined as a first state. A state in which conveying chuck 1 or wafer chuck 2 is released to the atmosphere within low-pressure chamber 16 is defined as a second state.

By causing first valve 7 to assume the first state during a suction operation of pump 10 while opening at least one of third valve 71 and fourth valve 72, provided in parallel, a differential pressure with respect to the pressure of the atmosphere within low-pressure chamber 16 is provided for conveying chuck 1, so that conveying chuck 1 can hold wafer 20 by suction. If first valve 7 is caused to assume the second state, the suction surface of conveying chuck 1 has the same pressure value as that within chamber 16, so that conveying chuck 1 cannot hold wafer 20 by suction. Similarly, by causing second valve 8 to assume the first state during a suction operation of pump 10 while opening at least one of fifth valve 81, sixth valve 82 and seventh valve 83, provided in parallel, a differential pressure with respect to the pressure of the atmosphere within low-pressure chamber 16 is provided for wafer chuck 2, so that wafer chuck 2 can hold wafer 20 by suction. If second valve 8 is caused to assume the second state, the suction surface of wafer chuck 2 has the same pressure value as that of the atmosphere within chamber 16, so that wafer chuck 2 cannot hold wafer 20 by suction.

In the present embodiment, the suction pressure for conveying chuck 1 is controlled for transferring and conveying operations of wafer 20 with respect to the wafer cassette, and transferring and conveying operations of wafer 20 with respect to wafer chuck 2 in the atmosphere of low-pressure chamber 16. The suction pressure for wafer chuck 2 is controlled for a transfer operation of wafer 20 in the atmosphere of a reduced pressure, a conveying operation of wafer 20 to an exposure position, and an exposure operation of wafer 20 at the exposure position.

Optimum values of the suction pressure for the above-described respective operations are determined as set values. The following table illustrates an example of the optimum values of the suction pressure in the respective operations.

value $P_{3W}$ of the suction pressure in an exposure operation is determined in terms of the absolute pressure.

The values $P_1$ and $P_{1W}$ of the suction pressure shown in No. 1 and the values $P_2$ and $P_{2W}$ of the suction pressure shown in No. 2 are determined in terms of the differential pressure with respect to the pressure $P_a$ of the atmosphere. These values are present between the maximum differential pressure corresponding to the maximum suction force and the critical differential pressure corresponding to the critical suction force for holding the wafer by suction. When the suction pressure is set to the pressure corresponding to the maximum suction force, reliability in the holding of the substrate by suction increases, but a long time is needed until the suction pressure of the suction surface for the wafer reaches the pressure corresponding to the maximum suction force, causing a decrease in the throughput of a transfer operation of the substrate. On the other hand, when the suction pressure is set to the critical differential pressure for holding the substrate, the throughput increases, but reliability in the holding of the substrate by suction decreases. Accordingly, these optimum values $P_1$, $P_{1W}$, $P_2$ and $P_{2W}$ of the suction pressure are determined to have different values for conveying chuck 1 and wafer chuck 2 so that both the reliability and throughput are sufficiently satisfied, in consideration of the area, surface roughness and the like of the suction surface for the wafer.

Figure 3:
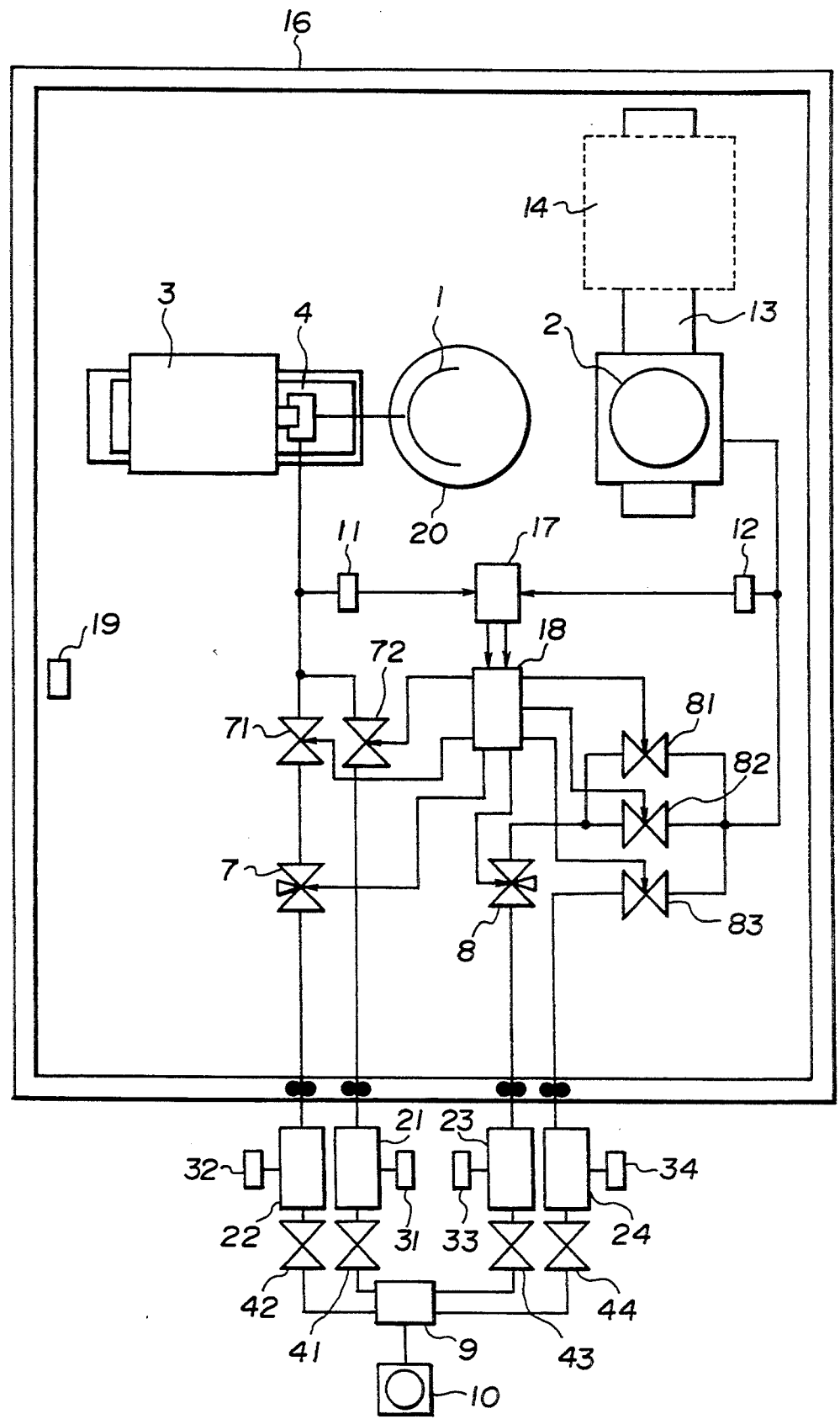
FIG. 3 is a diagram illustrating the configuration of a system according to a second embodiment of the present invention.

The optimum value $P_{3W}$ of the suction pressure for wafer chuck 2 in an exposure operation shown in FIG. 3 is determined in terms of the absolute pressure. As for the suction force for the wafer during an exposure operation, a large differential pressure with respect to the pressure of the atmosphere is preferable from the viewpoint of the corrective force for the plane of wafer 20 on the suction surface for the wafer, but a small differential pressure is preferable in order to reduce the thermal contact resistance of the suction surface. In the present embodiment, the optimum value $P_{3W}$ of the suction pressure is determined to be 70–80 Torr in terms

TABLE 1

Optimum values of the suction pressure for the conveying chuck and the wafer chuck for respective operations.

| | | | | Optimum suction pressure | |
|---|---|---|---|---|---|
| No. | Operation | Suction force | Effect | Conveying chuck | Wafer chuck |
| 1 | Conveyance Transfer | Maximum Critical | Reliability Throughput | $P_1$ (Differential pressure: 80 Torr) | $P_{1W}$ (Differential pressure: 50 Torr) |
| 2 | Transfer Transfer | Maximum Critical | Reliability Throughput | $P_2$ (Differential pressure: 100 Torr) | $P_{2W}$ (Differential pressure: 70 Torr) |
| 3 | Exposure | Maximum | Corrective force | — | $P_{3W}$ (Absolute pressure: 70–80 Torr) |
| | Exposure | Critical | Reduction of thermal contact resistance | | |

In Table 1, the optimum values $P_1$ and $P_2$ of the suction pressure in conveying and transferring operations of conveying chuck 1 are determined in terms of the values of the differential pressure with respect to the pressure of the atmosphere. The optimum values $P_{1W}$ and $P_{2W}$ of the suction pressure in conveying and transferring operations of wafer chuck 2 are determined in terms of the values of the differential pressure with respect to the pressure of the atmosphere. The optimum of the absolute pressure for the pressure $P_a$ of the atmosphere in consideration of a balance between the above-described corrective force and thermal contact resistance.

The setting of the optimum suction pressure necessary for each operation of conveying chuck 1 is realized by monitoring the pressure signal of first vacuum sensor 11 by main controller 17, instructing opening/closing of valves 71 and 72 to valve controller 18, and selecting one of the two lines having different conductance values. Similarly, the setting of the optimum suction pressure necessary for each operation of wafer chuck 2 is realized by monitoring the pressure signal of second vacuum sensor 12 by main controller 17, instructing opening/closing of valves 81, 82 and 83 to valve controller 18, and selecting one of the three lines having different conductance values.

Figure 2:
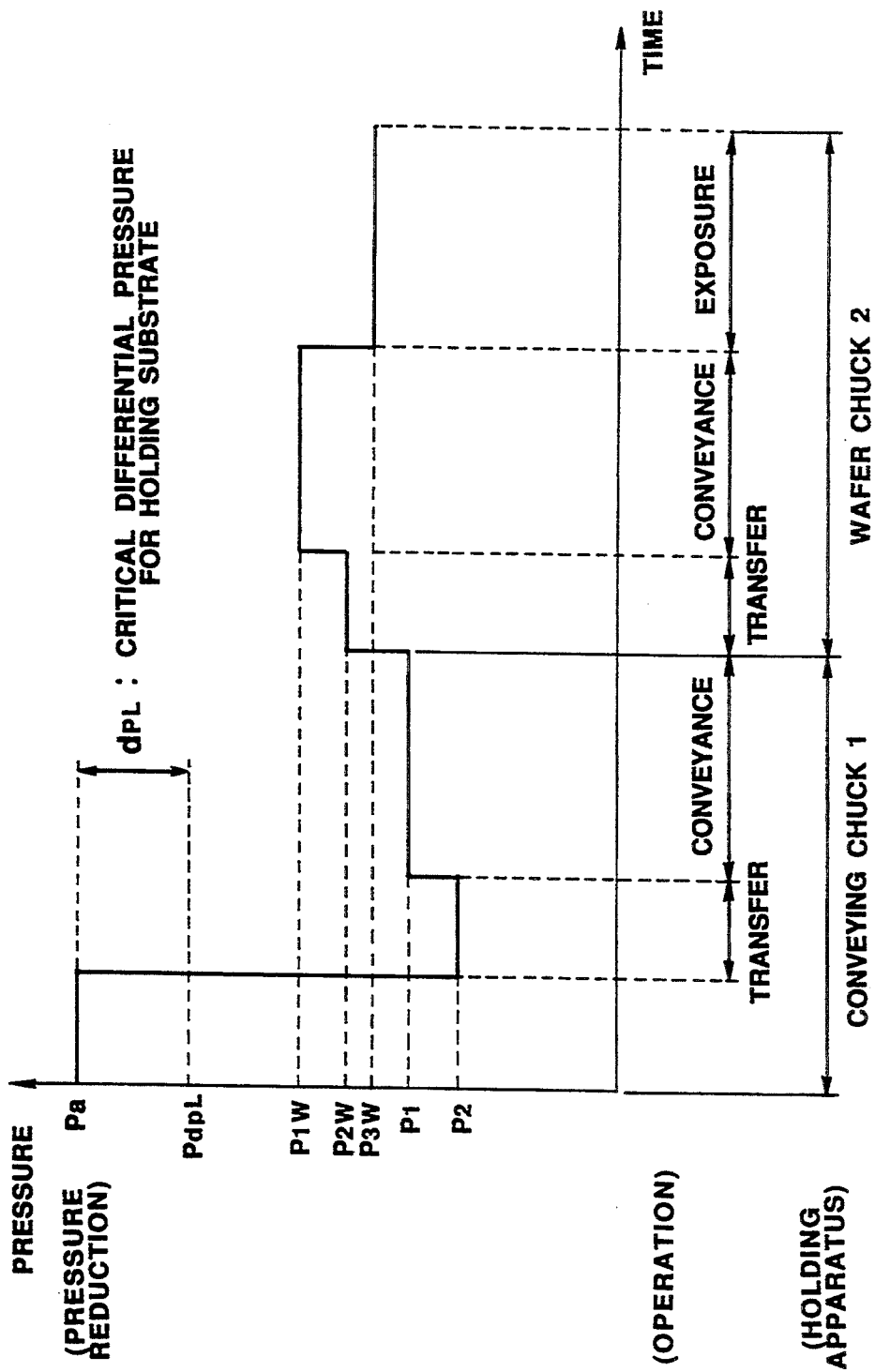
FIG. 2 is a diagram illustrating an operation of controlling suction pressure.

Next, a description will be provided of the details of the operation of the system of the present embodiment. FIG. 2 illustrates changes in the suction pressure in the respective operations. In FIG. 2, if the value of the critical differential pressure necessary for holding wafer 20 by suction in a reduced pressure $P_a$ of the atmosphere (for example, several hundreds of Torr) is represented by dPL, wafer 20 can be held by suction when the suction pressure is equal to or less than the pressure $P_{dPL}$ corresponding to the critical differential pressure.

It is assumed that in the initial state, both valves 7 and 8 assume the second state, that is, they are opened to the pressure of the atmosphere, fourth valve 72, fifth valve 81 and seventh valve 83 are closed, and third valve 71 and sixth valve 82 are opened. In this state, the suction surfaces of conveying chuck 1 and wafer chuck 2 are exposed to the same pressure as the pressure $P_a$ of the atmosphere.

First, by driving X-stage 3, conveying chuck 1 is moved in the direction of the wafer cassette provided within low-pressure chamber 16, and an operation of transferring wafer 20 from the wafer cassette is performed. Pump 10 is caused to assume the suction state, first valve 7 is switched to the first state, fourth valve 72 is opened, and third valve 71 is closed. Thus, conveying chuck 1 communicates with pump 10, and holds wafer 20 by suction. The conductance value of the line is designed so that the optimum suction pressure $P_2$ (differential pressure of 100 Torr) shown in the above-described Table 1 is obtained when third valve 71 is closed and fourth valve 72 is opened. While wafer 20 is held by suction by conveying chuck 1 with the optimum suction pressure $P_2$, conveying chuck 1 is moved by driving X-stage 3 in order to transfer the held wafer 20 to wafer chuck 2. During this transfer operation, the conductance value of the line is changed by opening third valve 71 and closing fourth valve 72 so that the suction pressure of conveying chuck 1 equals the optimum suction pressure $P_1$ (differential pressure of 80 Torr, as shown in Table 1).

When wafer 20 has been conveyed onto the suction surface of wafer chuck 2 by driving X-stage 3, wafer 20 held by conveying chuck 1 by suction is moved in the z-direction by driving Z-stage 4 until wafer 20 contacts the suction surface of wafer chuck 2.

When wafer 20 has contacted the suction surface of wafer chuck 2, second valve 8 is switched to the first state, seventh valve 83 is opened, fifth valve 81 and sixth valve 82 are closed, and wafer 20 is held by suction by wafer chuck 2. The conductance value of the line is designed so that the suction pressure of wafer chuck 2 at that time equals the optimum suction pressure $T_{2W}$ (differential pressure of 70 Torr) shown in the above-described Table 1. In this state, wafer 20 is held by suction by both conveying chuck 1 and wafer chuck 2. When the detection value of second vacuum sensor 12 has reached the pressure $P_{2W}$, first valve 7 is switched to the second state to release the holding of wafer 20 by suction by conveying chuck 1, so that wafer 20 is held by suction only by wafer chuck 2. Thereafter, by driving Z-stage 4 and X-stage 3, conveying chuck 1 is returned to the initial position.

Subsequently, wafer chuck 2 is moved to a predetermined exposure position by driving mechanism 13. During this movement, the optimum suction pressure of wafer chuck 2 is set to the value $P_{1W}$ (differential pressure of 50 Torr, as shown in Table 1) for an exposure operation by selecting the conductance value of the line by opening sixth value 82 and closing seventh valve 83 and fifth valve 81.

When wafer 20 has reached the exposure position, the conductance value of the line is set so that the suction pressure of wafer chuck 2 equals the optimum suction pressure $T_{3W}$ (absolute pressure of 70–80 Torr, as shown in Table 1) by opening fifth valve 81 and closing sixth valve 82 and seventh valve 88. In this state, a circuit pattern is exposed on wafer 20 by exposure apparatus 14.

After the completion of the exposure for wafer 20, wafer 20 is transferred to conveying chuck 1, and is accommodated within the wafer cassette by conveying chuck 1 by performing an operation which is reverse to the above-described operation sequence.

Although the system of the above-described embodiment is always maintained in an atmosphere of a reduced pressure, the system may be maintained at atmospheric pressure.

In the above-described embodiment, each of a plurality of parallel lines having different conductance values has a valve, and the conductance value of the entire vacuum line is set by selecting one of the lines. However, the following modifications may be considered.

(1) The conductance value of the entire vacuum line is set by switching between state (a), in which only one of a plurality of valves is opened, and state (b), in which the plurality of valves are simultaneously opened. The conductance value of each line is designed so that the respective optimum values of the suction pressure set in Table 1 are obtained for states (a) and (b).

(2) A valve is not provided in one of a plurality of parallel lines so that the line is always opened. The conductance value of the entire vacuum line is set by opening and closing remaining valves. The conductance value of each line is designed so that the respective optimum values of the suction pressure set in Table 1 are obtained in a plurality of states obtained by opening and closing the valves.

Second Embodiment

FIG. 3 is a diagram illustrating the configuration of a semiconductor manufacturing system according to a second embodiment of the present invention. Basically, the configuration of the present embodiment is obtained by adding some components to the configuration of the embodiment shown in FIG. 1. Hence, the same reference numerals as those shown in FIG. 1 represent the same or equivalent components. The optimum values of the suction pressure in respective operations in the present embodiment are the same as those shown in the above-described Table 1 and in FIG. 2.

Four vacuum lines branched from distributor 9 include valves 41 through 44 and accumulators 21 through 24, respectively. These components are provided outside low-pressure chamber 16. Accumulators 21 through 24 include vacuum sensors 31 through 34 for detecting corresponding pressure values, respectively. The outputs of vacuum sensors 31 through 34 are fed back, and the corresponding valves 84 through 87 are always controlled to be opened/closed so that accumulators 21 through 24 always have the predetermined pressure values shown in the above-described Table 1, respectively. The pressure values of accumulators 21 through 24 are maintained at values $P_2$, $P_1$, $P_{1W}$ and $P_{2W}$, respectively.

The conductance value of the vacuum line is designed so that the pressure of wafer chuck 2 equals the optimum pressure $P_{3W}$ for an exposure operation when accumulator 23 has the pressure value $P_{1W}$, fifth valve 81 is opened, and sixth valve 82 and seventh valve 83 are closed.

The opening/closing control of the respective valves in each operation sequence of the system of the present embodiment is the same as that in the above-described embodiment shown in FIG. 2. In the present embodiment, however, since an accumulator is provided in each line, the suction surface of conveying chuck 1 or wafer chuck 2 can instantaneously have the pressure value of the accumulator, i.e., the optimum suction pressure when the corresponding valve is opened. Hence, the throughput of the system can be improved compared with that of the above-described embodiment.

Third Embodiment

Figure 4:
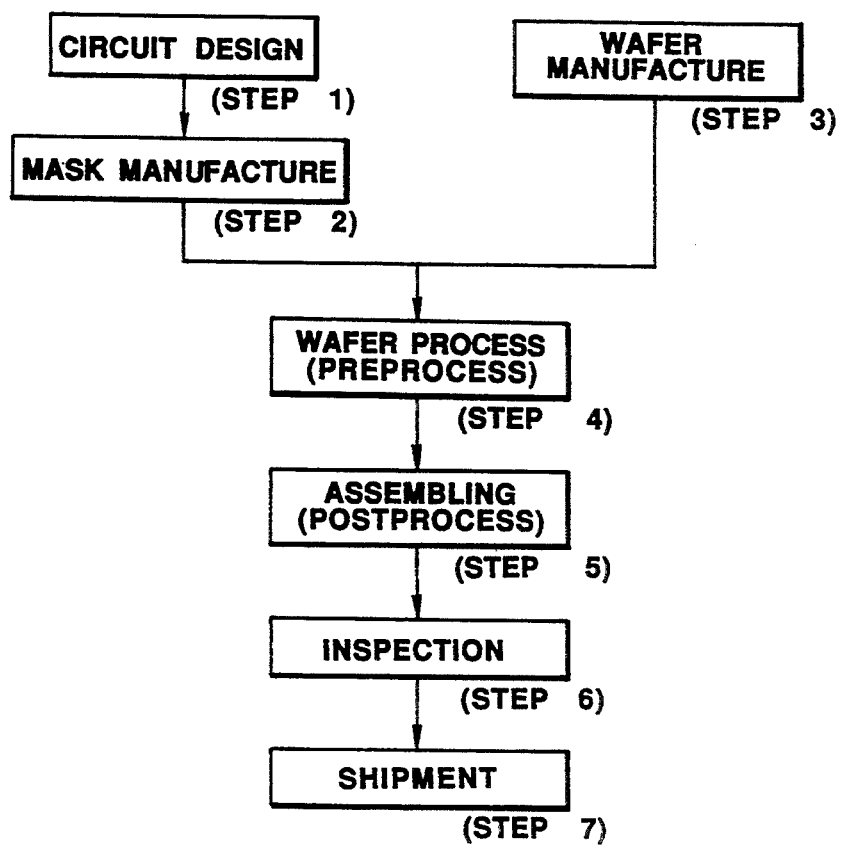
FIG. 4 is a diagram illustrating a flowchart for manufacturing semiconductor devices.

Next, a description will be provided of an embodiment relating to a semiconductor-device manufacturing method which utilizes the above-described semiconductor manufacturing system. FIG. 4 illustrates a flowchart for manufacturing semiconductor devices (semiconductor chips of IC's (integrated circuits), LSI's (large-scale integrated circuits) or the like, liquid-crystal panels, CCD's (charge-coupled devices), or the like). In step 1 (circuit design), circuit design of semiconductor devices is performed. In step 2 (mask manufacture), masks on which designed circuit patterns are formed are manufactured. In step 3 (wafer manufacture), wafers are manufactured using a material, such as silicon or the like. Step 4 (wafer process) is called a pre-process, in which actual circuits are formed on the wafers by means of photolithography using the above-described masks and wafers. The next step 5 (assembling) is called a post-process, which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests and the like of the semiconductor devices manufactured in step 5, are performed. The manufacture of semiconductor devices is completed after passing through the above-described processes, and the manufactured devices are shipped (step 7).

Figure 5:
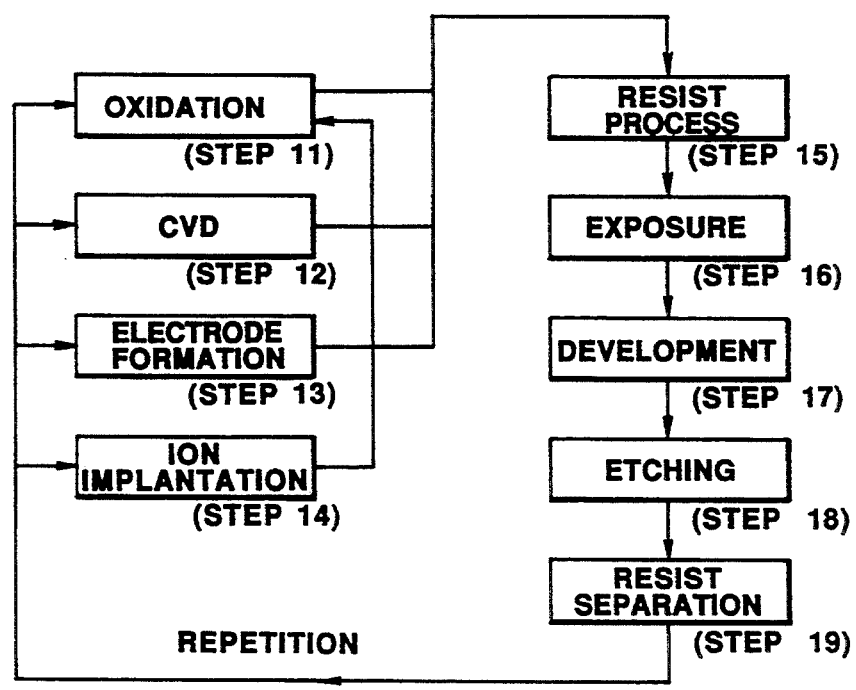
FIG. 5 is a diagram illustrating a detailed flowchart of a wafer process.
Figure 6:
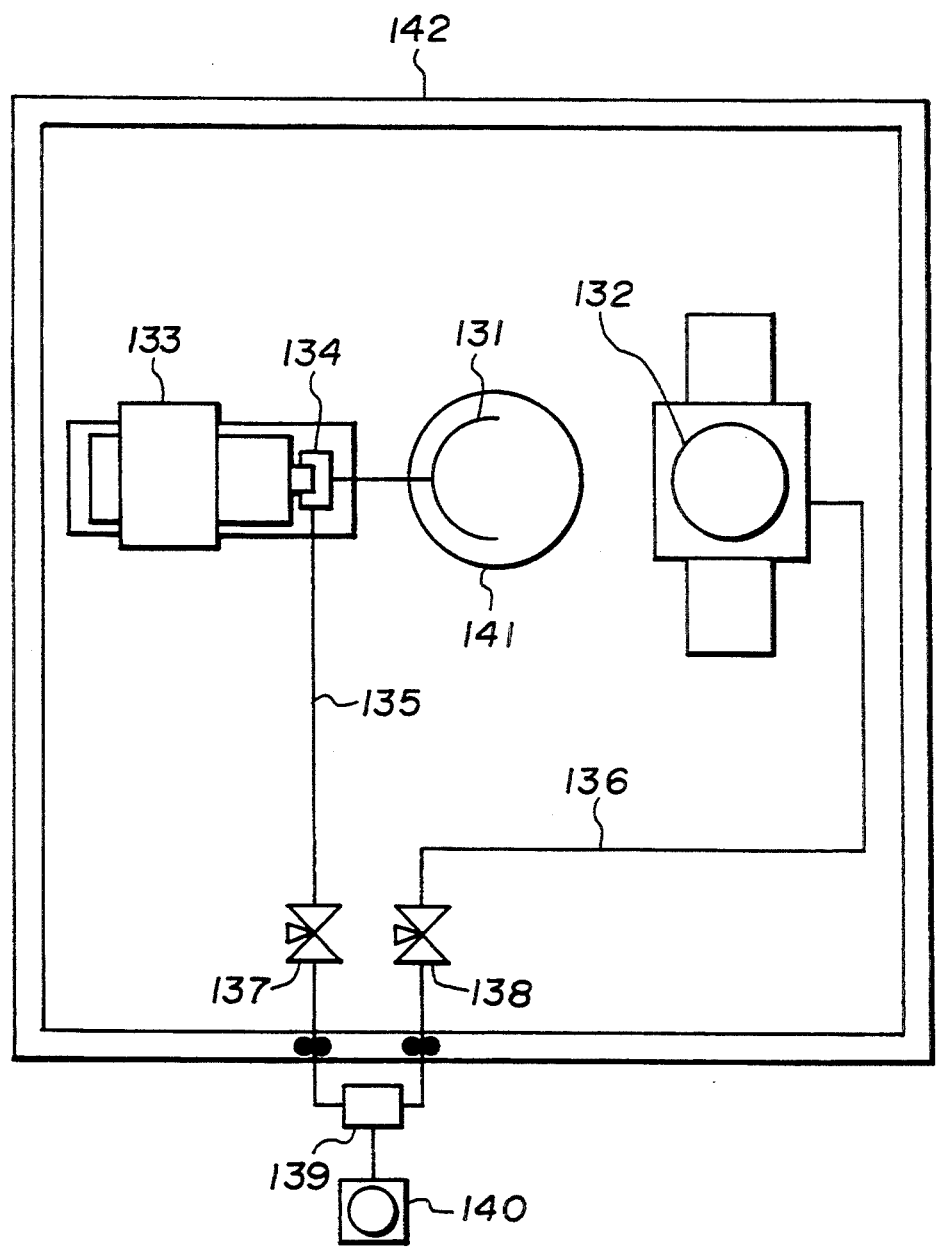

FIG. 5 illustrates a detailed flowchart of the above-described wafer process. In step 11 (oxidation), the surface of the wafer is oxidized. In step 12 (CVD), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer by the above-described semiconductor manufacturing system. In step 17 (development), the exposed wafer is developed. In step 18 (etching), portions other than the developed resist image are etched off. In step 19 (resist separation), the resist which becomes unnecessary after the completion of the etching is removed. By repeating these steps, a final circuit pattern made of multiple patterns is formed on the wafer. By using the manufacturing method of the present embodiment, it is possible to manufacture semiconductor devices with high productivity.

Except as otherwise disclosed herein, the various components shown in outline or in block form in the figures are individually well known and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An apparatus for holding a substrate, comprising:
   a suction source for providing suction;
   a first holding mechanism for holding the substrate by suction provided from said suction source,
   a second holding mechanism for holding the substrate by suction provided from said suction source;
   a first connection line arrangement for connecting said suction source to said first holding mechanism;
   a second connection line arrangement for connecting said suction source to said second holding mechanism, wherein at least one of said first and second connection line arrangements comprises parallel lines intermediate said connection arrangement and a valve arrangement comprising at least one valve provided in at least one of the parallel lines; and
   a controller for controlling opening/closing of said valve arrangement, to adjust the conductance of at least one of said first and second connection line arrangements.

2. An apparatus according to claim 1, wherein said first holding mechanism is capable of transferring a plurality of substrates to said second holding mechanism.

3. An apparatus according to claim 1, further comprising a sensor for detecting pressure at said holding mechanism.

4. An apparatus according to claim 1, further comprising exposure means for exposing the substrate.

5. A substrate holding apparatus, comprising:
   a suction source for providing suction;
   a first holding mechanism for holding a subtrate by suction provided from said suction source;
   a connection line for connecting said suction source to said holding mechanism, said connection line comprising an adjustment mechanism for adjusting the conductance of said connection line being provided intermediate said connection line; and
   an accumulator provided intermediate said connection line for assisting said adjustment mechanism in adjusting the conductance of said connection line.

6. An apparatus according to claim 5, further comprising a second holding mechanism for holding the substrate by suction provided from said suction source.

7. An apparatus according to claim 5, further comprising a sensor for detecting pressure at said holding mechanism.

8. An apparatus according to claim 5, further comprising exposure means for exposing the substrate.

9. A method of holding and exposing a substrate, said method comprising the steps of:
providing a suction source that provides suction;
providing a holding mechanism that holds a substrate by suction from the suction source;
providing a connection line for connecting the suction source to the holding mechanism, the connection line having an accumulator intermediate the connection line;
providing suction to the holding mechanism to hold the substrate;
adjusting the conductance of the connection line by using the accumulator; and
exposing the held substrate.

10. A method according to claim 9, further comprising detecting pressure at the holding mechanism.

11. An apparatus according to claim 6, wherein said first holding mechanism is capable of transferring a plurality of substrates to said second holding mechanism.

12. A method of holding and exposing a substrate, said method comprising the steps of:
providing a suction source that provides suction;
providing a first holding mechanism that holds the substrate by suction;
providing a second holding mechanism that holds the substrate by suction;
providing a first connection line arrangement for connecting the suction source to the first holding mechanism;
providing a second connection line arrangement for connecting the suction source to the second holding mechanism, wherein at least one of the first and second connection line arrangements comprises parallel lines intermediate the connection arrangement, and a valve arrangement having at least one valve provided in at least one of the parallel lines;
controlling opening/closing of the valve arrangement to adjust the conductance of at least one of the first and second connection line arrangements;
holding the substrate by suction provided to one of the holding mechanisms; and
exposing the held substrate.

13. A method according to claim 12, further comprising detecting pressure at the holding mechanism.

14. An apparatus for holding a substrate, comprising:
a suction source for providing suction;
a first holding mechanism for holding the substrate by suction provided from said suction source,
a second holding mechanism for holding the substrate by suction provided from said suction source;
a first connection line arrangement for connecting said suction source to said first holding mechanism;
a second connection line arrangement for connecting said suction source to said second holding mechanism, wherein at least said first connection line arrangement comprises a line from said suction source that branches into a plurality of parallel lines, meets again, and is connected to said first holding mechanism, and a valve is provided in at least one of the branched plurality of lines; and
a controller for controlling opening/closing of said valve, to adjust the conductance of at least said first connection line arrangement.

15. A method of holding and exposing a substrate, said method comprising the steps of:
providing a suction source that provides suction;
providing a first holding mechanism that holds the substrate by suction;
providing a second holding mechanism that holds the substrate by suction;
providing a first connection line arrangement for connecting the suction source to the first holding mechanism;
providing a second connection line arrangement for connecting the suction source to the second holding mechanism, wherein at least the first connection line arrangement comprises a line from the suction source that branches into a plurality of lines, meets again, and is connected to the first holding mechanism, and providing a valve in at least one of the branched plurality of lines;
controlling opening/closing of the valve to adjust the conductance of at least the first connection line arrangement;
holding the substrate by suction provided to one of the holding mechanisms; and
exposing the held substrate.

* * * * *